United States Patent [19]

Yim et al.

[11] Patent Number: 5,083,045
[45] Date of Patent: Jan. 21, 1992

[54] HIGH VOLTAGE FOLLOWER AND SENSING CIRCUIT

[75] Inventors: Young-Ho Yim, Daegu; Jae-Young Do, Seoul, both of Rep. of Korea

[73] Assignee: SamSung Electronics Co., Ltd., Suwon, Rep. of Korea

[21] Appl. No.: 481,817

[22] Filed: Feb. 20, 1990

Related U.S. Application Data

[63] Continuation of Ser. No. 277,761, Nov. 30, 1988, abandoned.

[30] Foreign Application Priority Data

Nov. 30, 1987 [KR] Rep. of Korea ............. 13611/1987

[51] Int. Cl.⁵ .................................................. H03K 5/153
[52] U.S. Cl. ............................... 307/350; 307/296.1; 307/363
[58] Field of Search .................. 307/350, 363, 272.3, 307/296.4, 296.5, 296.8, 296.1

[56] References Cited

U.S. PATENT DOCUMENTS

| | | | |
|---|---|---|---|
| 4,658,156 | 4/1987 | Hashimoto | 307/350 |
| 4,706,011 | 11/1987 | Vergara et al. | 307/363 |
| 4,709,165 | 11/1987 | Higuchi et al. | 307/350 |
| 4,709,172 | 11/1987 | Williams | 307/350 |
| 4,812,680 | 3/1989 | Kawashima et al. | 307/350 |

*Primary Examiner*—John Zazworsky
*Attorney, Agent, or Firm*—Robert E. Bushnell

[57] ABSTRACT

An on-chip circuit for producing signals to enable the operation of a circuit of special mode by sensing an externally applied signal to the chip or for supplying the externally applied voltage directly to the circuit in a special mode. The circuit includes an input terminal for inputting externally applied voltage, a controlling node, an output node, a voltage drop element connected between the input terminal and said controlling node to drop the input voltage, a first voltage supplying a terminal for supplying first bias voltage to the controlling node, a second voltage supplying terminal for receiving a second bias voltage, a switching element responsive to the voltage of the controlling node for providing a conducting path between said controlling node and said output node, a third voltage supplying terminal for receiving a third bias voltage, a constant current supply means connected between said third voltage supplying terminal and said output node for constantly supplying the same current to said output node, an output element connected with said output node for producing a signal of a specified logic level when the voltage of said output node exceeds a certain voltage level, a first output terminal connected with said output node and a second output terminal connected with said output element, whereby said first output terminal delivers a first output voltage following the externally applied voltage and said second output terminal delivers a second output voltage having a logic level according to said first output voltage.

21 Claims, 3 Drawing Sheets

HIGH VOLTAGE FOLLOWER AND SENSING CIRCUIT

This is a continuation of application Ser. No. 07/277,761, filed Nov. 30, 1988, now abandoned.

BACKGROUND OF THE INVENTION

The present invention relates to an on-chip circuit for use in a semiconductor device for sensing externally applied voltage thereto, wherein the circuit is coupled to a circuit of special mode in the semiconductor chip to simplify the test and evaluation thereof, and more particularly a circuit for producing signals to enable the operation of the circuit of special mode by sensing the externally applied signal to the chip or for supplying the externally applied voltage directly to the circuit of special mode.

As the semiconductor memory has been highly integrated into large scale and efforts made to attain more reliability in its application, the semiconductor chip itself has contained a circuit for various testing modes other than a normal Read/Write mode or a circuit for measuring various electrical characteristics of the chip. Such a special mode circuit does not work in the normal read/write mode, producing no influence upon the chip. Further, the circuit of special mode serves as a buffer to transfer the signal of externally applied voltage over a certain voltage level into the inside of the chip or usually includes a sensing circuit for producing a signal to enable the circuit of special mode and disable the circuit of normal Read/Write mode.

FIG. 1A illustrates an embodiment of a prior art circuit for sensing high voltage which utilizes the high threshold voltage of a conventional field effect transistor and FIG. 1B the output characteristic thereof. Referring to FIG. 1A, field effect transistor 1 has a gate receiving the input voltage of Vi, a source connectable with the ground voltage Vss and a drain connected with node point 4. The threshold voltage of the transistor 1 is equal to or more than 5 volts. P-channel MOS field effect transistor (MOSFET) 2 has a drain connected with the node point 4, a source connected with source supplying voltage Vcc and a gate grounded. To the node point 4 is connected inverting gate 3.

If the input voltage Vi applied to field effect transistor 1 is lower than the threshold voltage, the transistor is in an off-state. However, P-channel MOSFET 2 with a grounded gate, is in an on-state, and therefore, the voltage of node point 4 maintains the level of source supplying voltage Vcc, thereby keeping the output voltage Vo of the inverting gate in the state of logic low level. Although FIG. 1A illustrates an example that the P-MOSFET 2 whose gate is grounded is placed between the field effect transistor 1 and the source supplying voltage Vcc, an N-MOSFET whose gate is connected with the source supplying voltage may be used instead of the P-MOSFET 2. If an N-MOSFET transistor is used and the input voltage Vi is less than the threshold voltage of the field effect transistor 1, the voltage of node point 4 will amount to the difference between the source supplying voltage Vcc and the threshold voltage of the N-MOSFET and therefore, the output voltage Vo of inverting gate 3 maintains the logic low level. If the input voltage Vi continuously increases towards a value more than the threshold voltage of field effect transistor 1 as a voltage V2 shown in FIG. 1B, a fixed amount of current flows through the field effect transistor 1, and therefore the voltage of node point 4 becomes lower. If the voltage of node point 4 becomes low enough to trip the inverting gate 3, the output voltage Vo is turned over into the logic high level as V1 shown in FIG. 1B, and the voltage applied to the input terminal serves to operate the circuit of special mode. In such a circuit for sensing high voltage, the adjustment of voltage to trip the inverting gate 3 can be accomplished only by controlling the threshold voltage of the field effect transistor. Furthermore, even if the circuit for sensing high voltage as described above can produce a signal to operate the circuit of special mode upon receiving input voltage thereto exceeding a certain voltage level, there is no way that the voltage applied to the input terminal can be further applied to the inside of the chip.

SUMMARY OF THE INVENTION

It is an object of the present invention to provide a high voltage follower and sensing circuit for producing a signal to enable operation of a circuit of special mode by sensing externally applied signals of a semiconductor chip.

It is another object of the present invention to provide a high voltage follower and sensing circuit for directly supplying the externally applied signal to the circuit of special mode inside the chip.

According to the present invention, a high voltage follower and sensing circuit therefor comprises an input terminal for inputting externally applied voltage, a controlling node, an output node, a voltage drop stage connected between the input terminal and the controlling node to drop the input voltage, a first voltage supplying terminal for supplying first bias voltage to the controlling node, a second voltage supplying terminal for receiving second bias voltage, a switching element responsive to the voltage of the controlling node for providing a conducting path between the controlling node and the output node, a third voltage supplying terminal for receiving a third bias voltage, a depletion FET stage connected between the third voltage supplying terminal and the output node for enabling constant current to flow through the output node, an output element connected with the output node for producing a signal of a specified logic level when the voltage of the output node exceeds a certain voltage level, a first output terminal connected with the output node and a second output terminal connected with the output element, whereby the first output terminal delivers a first output voltage following the externally applied voltage and the second output terminal delivers second output voltage having a logic level according to the first output voltage.

DETAILED DESCRIPTION OF A PREFERRED EMBODIMENT OF THE INVENTION

The present invention will now be described specifically with reference to the drawings attached by way of example only.

Figure 1A:
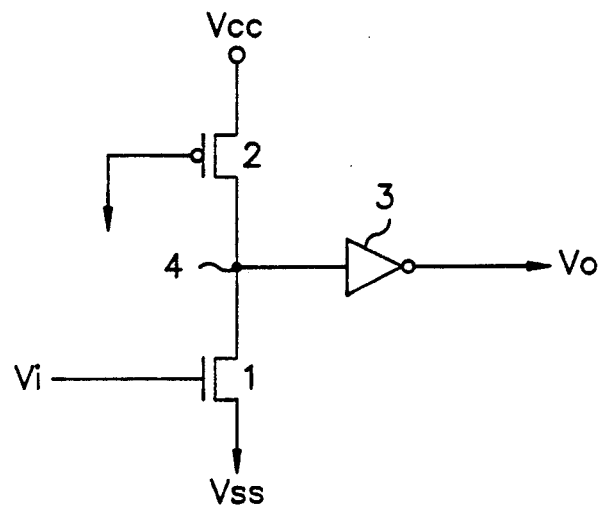
FIGS. 1A and 1B respectively show a schematic diagram of a prior art circuit for sensing high voltage, and the input and output characteristic curve therein.
Figure 1B:
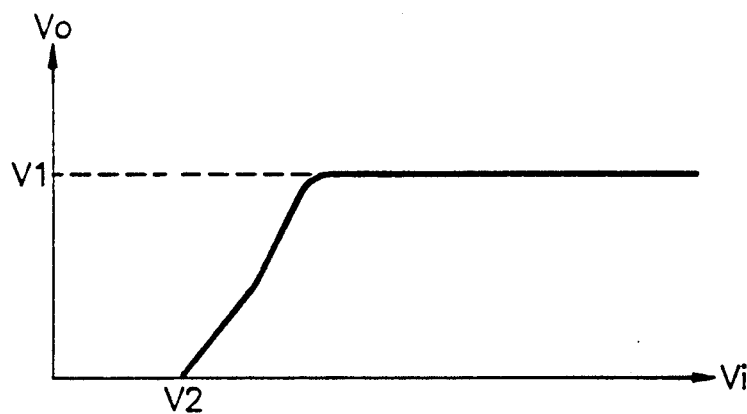
Figure 2:
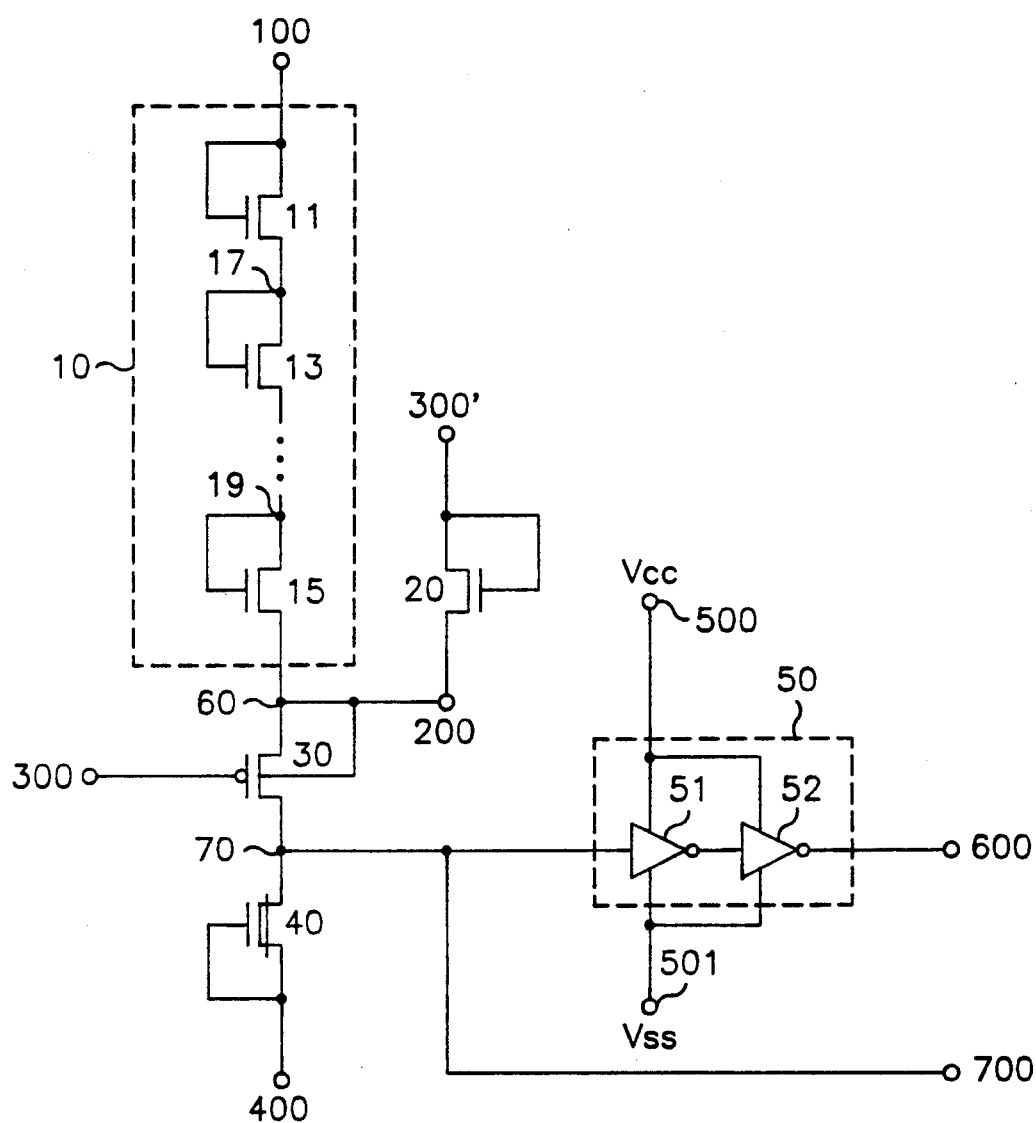
FIG. 2 shows an schematic circuit diagram for embodying the present invention.

Referring FIG. 2, the high voltage follower and sensing circuit according to the present invention includes input terminal 100 for inputting externally applied voltage, controlling node 60, output node 70, voltage drop stage 10 connected between said input terminal 100 and said controlling node 60 to drop said input voltage, first voltage supplying terminal 200 for supplying first bias voltage to the controlling node, second voltage supplying terminal 300 for receiving second bias voltage, P-MOSFET 30 whose channel is connected between controlling node 60 and output node 70, the drain and substrate (or well) are connected to controlling node 60, and the gate is connected to the second bias voltage, third voltage supplying terminal 400 for receiving a third bias voltage, depletion FET 40 whose channel is connected between said third voltage supplying terminal 400 and output node 70, and the gate of FET 40 is connected to third voltage supplying terminal 400 for enabling supply of constant current to output node 70, buffer 50 connected with output node 70 and having an even number of inverting gates 51, 52 in series, first output terminal 700 connected with said output node 70, and second output terminal 600 connected with said buffer 50. The voltage drop stage 10 includes a plurality of N-channel enhancement MOSFETs 11,13,15 connected in series with each other, whose gates respectively are connected with the drains. The input terminal 100 is connected with the drain of the MOSFET 11, and the controlling node 60 is connected with the source of the MOSFET 15. First voltage supplying terminal 200 is connected with controlling node 60, and receives the first bias voltage. Second voltage supplying terminal 300 receives the second bias voltage. The P-MOSFET 30 has a channel between the controlling node 60 and output node 70, and its drain and substrate (or well) are supplied with the same voltage as controlling node 60. The gate of MOSFET 30 receives the second bias voltage. The third bias voltage is supplied through the third voltage supplying terminal 400, Depletion FET 40 whose gate is connected with third voltage supplying terminal 400 has a channel connected between output node 70 and the third voltage supplying terminal 400. Buffering means 50 includes an even number of inverting gates 51, 52 connected in series with each other between output node 70 and second voltage output terminal 600. First voltage output terminal 700 is connected with output node 70.

The first bias voltage can be supplied to the first voltage supplying terminal in various ways. FIG. 2 shows an example that, through N-MOSFET 20 whose gate and drain are connected with second voltage supplying terminal 300, there is supplied a voltage which is dropped by the threshold voltage of N-MOSFET 20. It can be easily noted that, to a fourth voltage supplying terminal 500 and a fifth voltage supplying terminal 501 connected respectively with the inverting gates 51 and 52 of buffer 50, there are supplied respectively the source supplying voltage Vcc and ground voltage Vss which are employed in conventional CMOS inverting gate technology.

Figure 3:
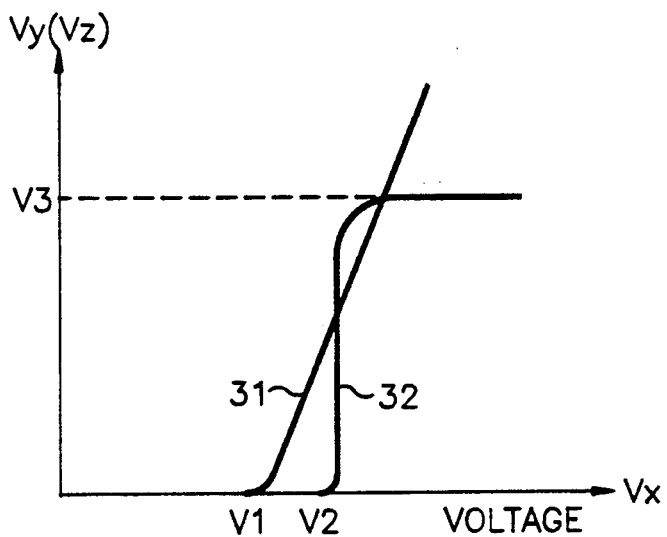
FIG. 3 is a graph diagram for illustrating the variations in first and second output voltages according to the input voltage in accordance with the principles of present invention.
Figure 4:
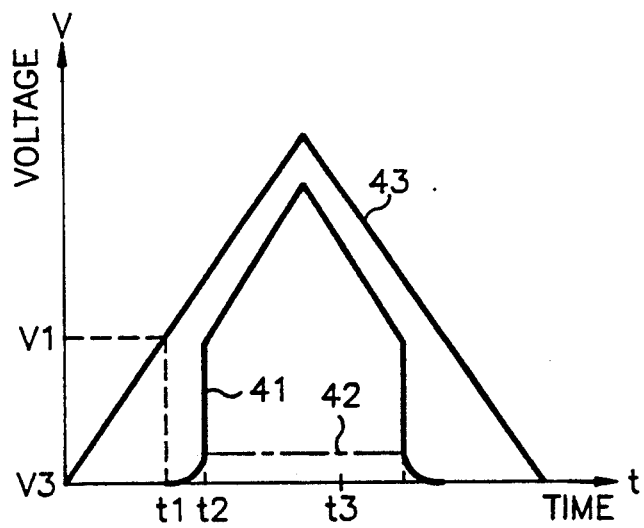
FIG. 4 is another graph diagram for illustrating variations in first and second output voltages according to the time variation of the input voltage in accordance with the present invention.

Referring to FIGS. 3 and 4, the operations of the circuit as shown in FIG. 2 will now be specifically described. FIG. 3 shows a diagram for illustrating the changes of the first and second output voltages produced from the first and second output terminals 700 and 600 according to the input voltage, while FIG. 4 shows a diagram for illustrating the changes of the first and second output voltages according to the time variation of the input voltage. When the input voltage Vx of input terminal 100 is increased from zero, the voltage supplied to node 17 is the voltage which is dropped from the input voltage Vx by the threshold voltage (hereinafter referred to as Vtn) of the N-MOS transistor, and follows the input voltage Vx, since the N-MOS transistors 11, 13, 15 serve as diodes. Node 19 connected with the drain of Xth N-MOS transistor 15 of voltage drop stage 10, wherein the X number of N-MOS transistors are connected in series with input terminal 100, has a voltage level which is dropped from the input voltage Vx by the amount of $(X-1) \cdot Vtn$, and thereby follows the input voltage Vx. If the input voltage Vx is less than the amount of $X \cdot Vtn$, the current flowing through controlling node 60 by the input voltage is blocked out. At this time, in order to prevent possible floating of controlling node 60, the first bias voltage Vb1 is supplied to the controlling node 60 through the first voltage supplying terminal 200. To the first voltage supplying terminal is supplied a voltage which is dropped by the voltage of Vtn from a second bias voltage Vb2 supplied through second voltage supplying terminal 300.

Consequently, the voltage level of controlling node 60 maintains the value Vb1 (that is, $Vb2-Vtn$) if the input voltage Vx does not exceed the amount $X \cdot Vtn$, while it follows that the input voltage Vx has a value of $(Vx - X \cdot Vtn)$ if the input voltage Vx exceeds the value $X \cdot Vtn$. On the other hand, if the input voltage Vx is equal to a value of $(Vb2 + X \cdot Vtn - |Vtp|)$, wherein Vtp is a threshold voltage of the P MOS transistor), the voltage of the controlling node 60 becomes $Vb2 - |Vtp|$, and to the source and substrate (or well) of the P-MOS transistor 30 is supplied the same voltage as the controlling node 60. Further, since second bias voltage Vb2 is applied to the second voltage supplying terminal connected with the gate, the P-MOS transistor 30 is turned ON, and to output node 70 is supplied the voltage of $(Vx - X \cdot Vtn + |Vtp|)$.

The P-MOS transistor 30 serves as a switch to block the current flow, except for the case in which the voltage of controlling node 60 is dropped by a certain amount according to the input voltage Vx being greater by the threshold voltage Vtp of the P-MOS transistor 30 than second bias voltage Vb2. It will be easily appreciated to those skilled in the art that, if the ground voltage Vss is supplied to the third voltage supplying terminal 400, a constant current always flows through the conducting channel of the switching means 30 which is turned ON and the output node 70 via depletion FET 40, that therefore, the voltage of the output node 70 increases along with the voltage of $(Vx - X \cdot Vtn + |Vtp|)$.

Referring to FIG. 3, the curve 31 illustrates the first output voltage Vy provided at the first voltage output terminal 700 through the output node 70. If the input voltage Vx exceeds a value $V1 = (Vb2 + X \cdot Vtn - |Vtp|)$, the P-MOS transistor 30 is turned ON when the first output voltage Vy following the input voltage Vx is produced through the output node 70 and the first voltage output terminal 700. On the other hand, if the voltage of the output node 70 increases to a value (the voltage V2 in FIG. 3) large enough to trip the inverting gates 51,52 of buffer 50 then, through second voltage output terminal 600 is provided the second output voltage Vz, as is shown by the curve 32, changed from logic LOW level to logic HIGH level. It should be noted that the second output voltage Vz selectively maintains, in accordance with the voltage of output node 70, the voltage level of Vcc and Vss supplied to the fourth and fifth voltage supplying terminals. Referring FIG. 3, the curve 32 illustrates the second output voltage Vz produced from second voltage output terminal 600 through buffer 50, in which if the input voltage Vx equals or exceeds the voltage level V2 (the tripping voltage of the inverting gate), the inverting gates 51,52 produce the second output voltage Vz of the voltage level V3 (=Vcc) supplied to the fourth voltage supplying terminal 500.

Referring to FIG. 4, reference numeral 43 indicates the input voltage Vx, 42 the second output voltage Vz provided at second voltage output terminal 600 through buffer 50, and 41 the first output voltage Vy provided at first voltage output terminal 700 through output node 70. As shown in the drawing, if the input voltage Vx is gradually increased at a certain slope with the time variation, the voltage V1 applied at time t1 turns ON the switching stage 30 so as to cause flow of a certain amount of current to depletion FET 40 through output node 70, the first output voltage Vy has a fixed amount of voltage drop Vtp to follow the input voltage Vx, and, at time t2, buffer stage 50 is tripped by the first output voltage Vy to produce the second output voltage of Vcc level (the voltage V3 in FIG. 3) supplied to the fourth voltage supplying terminal from the second voltage output terminal 600. Additionally, if the input voltage Vx is gradually decreased from a voltage level (at time t3) considerably higher than the voltage necessary to trip the buffer 50, the second output voltage 42 is blocked and maintains zero voltage level below the voltage to trip the buffer 50. Also, the first output voltage 41 is blocked and maintains the zero voltage level below the voltage V1, as shown in the drawing.

As described above, if the input voltage does not exceed the voltage level of V1=(Vb2+X·Vtn−|Vtp|), the current is blocked to the output node, while if the input voltage is higher than the voltage level V1, there are produced the first output voltage following the input voltage and the second output voltage outputting a certain logic state. Therefore, there is obtained a buffer which supplies the externally applied voltage to the inside of a chip without power consumption in the normal Read/Write mode. Further, the advantage accompanies that the high voltage sensing point for generating the high voltage sensing signal can be adjusted without any change of the manufacturing process.

While the invention has been particularly shown and described with reference to a preferred embodiment, it will be understood by those skilled in the art that modifications in detail may be made without departing from the spirit and scope of the invention.

What is claimed is:

1. In a semiconductor device, a high voltage follower and sensing circuit, comprising:
    an input terminal for inputting an externally applied voltage;
    a controlling node;
    an output node;
    voltage drop means connected between said input terminal and said controlling node to drop the input voltage;
    first voltage receiving means for receiving and supplying a first bias voltage to said controlling node;
    switching means connected between said controlling node and said output node for providing a conducting path therefor in response to the voltage of said controlling node;
    second voltage receiving means for receiving a second bias voltage; and
    depletion means connected between said second voltage receiving means and said output node for enabling current flow to said output node;
    whereby the input voltage equal to or exceeding a specified level of said input voltage is sensed and followed through said output node.

2. The circuit of claim 1, further comprising:
    output means connected with said output node for producing a signal of a specified logic level when the voltage of said output node is equal to or exceeds a specified voltage level;
    a first output terminal connected with said output node for providing a first output voltage; and
    a second output terminal connected with said output means for providing a second output voltage;
    whereby said first output terminal delivers the first output voltage following the externally applied input voltage and said second output terminal delivers the second output voltage having a logic level according to said first output voltage.

3. The circuit of claim 2, wherein said switching means comprises a P-channel MOSFET, the channel of said MOSFET being connected between said controlling node and said output node, the gate of said MOSFET being connected with a voltage terminal, and the substrate of said MOSFET being connected with said controlling node.

4. The circuit of claim 3, wherein said voltage drop means comprises a plurality of N-channel enhancement MOSFETs connected in series to each other, each gate of said N-channel MOSFETs being connected to a drain of a corresponding one of said N-channel MOSFETs, the input voltage being dropped by the sum of each threshold voltage of said N-channel MOSFETs.

5. The circuit of claim 4, wherein said depletion means comprises a depletion MOSFET having a channel connected between said output node and said second voltage receiving means, and a gate connected to said second voltage receiving means.

6. The circuit of claim 5, wherein said output means comprises an even number of inverting gates connected in series between said output node and said second voltage output terminal.

7. The circuit of claim 6, wherein the first bias voltage of said first voltage receiving means provides at said controlling node, a first voltage decreased by a threshold voltage of a n-channel enhancement MOSFET connected between said first voltage receiving means and said controlling node.

8. A semiconductor device having a high-voltage sensing circuit, said device comprising:
    first means, coupled between an input terminal and a first node, and having a plurality of series coupled N-channel transistors with drains and gates respectively coupled together to make a diode connection for each of said N-channel transistors, for reducing a voltage level of an input signal applied through said terminal, said first node being connected to a source of a lowermost one of said N-channel transistors in said first means;

second means having another N-channel transistor with a drain and gate coupled in common and connectable to receive a first supply voltage and with a source coupled to said first node;

a P-channel transistor having a P-channel, a source-drain path between said first node and a second node and a gate connectable to receive the first supply voltage, and a substrate coupled to said first node;

means connectable between said second node and a second supply voltage, for enabling current flow to said second node; and means coupled to said second node, for providing a first output voltage to a first output terminal.

9. The circuit of claim 8, wherein said means coupled to said second node, for providing an output voltage to an output node comprises:

buffer means connected with said second node for producing a signal of a specified logic level when the voltage of said second node is equal to or exceeds a specified voltage level;

said first output terminal connected with said second node for providing said first output voltage; and a second output terminal connected with said buffer means for providing a second output voltage;

whereby said first output terminal delivers the first output voltage following the input signal and said second output terminal the second output voltage having a logic level according to said first output voltage.

10. The circuit of claim 9, wherein said means for enabling current flow comprises a depletion MOSFET having a channel connectable between said second node and said second supply voltage.

11. The circuit of claim 10, wherein said buffer means comprises an even number of inverting gates connected in series between said second node and said second output terminal.

12. A semiconductor device having a high-voltage sensing circuit, said device comprising:

first means, coupled between an input terminal and a first node, and having a plurality of series coupled N-channel transistors with drains and gates respectively coupled together to make a diode connection for each of said N-channel transistors, for reducing a voltage level of an input signal applied through said terminal, said first node being connected to a source of a lowermost one of said N-channel transistors in said first means;

second means having another N-channel transistor with a drain and gate coupled in common and connectable to receive a first supply voltage and with a source coupled to said first node;

a P-channel transistor having a P-channel, a source-drain path between said first node and a second node and a gate connectable to receive the first supply voltage, and a substrate coupled to said first node;

means connectable between said second node and a second supply voltage, said means connectable between said second node and said second supply voltage including a depletion-transistor current having a gate and a source coupled in common and connectable to said second supply voltage and a drain coupled to said second node, for enabling current flow to said second node; and means coupled to said second node, for providing a first output voltage to a first output terminal.

13. A high voltage follower and sensing circuit in a semiconductor circuit comprising:

a voltage drop means connected between an input terminal and a controlling node, wherein said input terminal receives a voltage applied externally to said semiconductor circuit;

a first voltage supply terminal for receiving and supplying a first bias voltage to said controlling node;

a first transistor having a P-channel connected between an output node and said controlling node, and having a gate for receiving a second bias voltage;

a second transistor having a channel connected between said output node and a reference voltage and having a gate connected to said reference voltage, for enabling current flow through said controlling node;

a first voltage output terminal connected to said output node; and a buffer means connected between said output node and a second output terminal.

14. The high voltage follower and sensing circuit in a semiconductor circuit as claimed in claim 13, further comprising:

a third transistor having a channel connected to receive said second bias voltage for supplying said first bias voltage to said first voltage supply terminal.

15. The high voltage follower and sensing circuit in a semiconductor circuit as claimed in claim 14, wherein said voltage drop means comprises:

a plurality of serially diode connected transistors wherein a drain and gate of a first one of said serially diode connected transistors are connected in common with said input terminal and wherein a last one of said serially diode connected transistors has a source connected to said controlling node.

16. The high voltage follower and sensing circuit in a semiconductor circuit as claimed in claim 15, wherein said first transistor is a P-channel MOSFET.

17. The high voltage follower and sensing circuit in a semiconductor circuit as claimed in claim 16, wherein said second transistor is an depletion FET.

18. The high voltage follower and sensing circuit in a semiconductor circuit as claimed in claim 17, wherein said plurality of serially diode connected transistors and said third transistor are N-channel MOSFET.

19. The high voltage follower and sensing circuit in a semiconductor circuit as claimed in claim 13, wherein said buffer means comprises:

a number of serially connected inverting gates, wherein a first one of said inverting gates has an input connected to said output node and wherein a last one of said inverting gates has an output connected to said second voltage output terminal, and wherein each of said number of inverting gates is supplied with a source supply voltage and a ground supply voltage.

20. The high voltage follower and sensing circuit in a semiconductor circuit as claimed in claim 19, wherein said number is an even number.

21. The high voltage follower and sensing circuit in a semiconductor circuit as claimed in claim 20, wherein said first output voltage terminal provides a first output voltage which follows said voltage applied externally to said semiconductor and said second output voltage terminal provides a logic output voltage corresponding to said first output voltage.

* * * * *

UNITED STATES PATENT AND TRADEMARK OFFICE
CERTIFICATE OF CORRECTION

PATENT NO. : 5,083,045

DATED : 21 January 1992

INVENTOR(S) : Yong-Ho YIM et al.

It is certified that error appears in the above-identified patent and that said Letters Patent is hereby corrected as shown below:

Column 2, Line 59, replace "an" with --a--;

Column 3, Line 7, insert --to-- after "Referring";

Line 26, insert --is-- after "50";

Line 28, insert --is-- after "700";

Line 29, insert --is-- after "600";

Column 5, Line 9, insert --to-- after "Referring";

Column 8, Claim 17, line 43, replace "an" with --a--.

Signed and Sealed this

Twenty-seventh Day of April, 1993

*Attest:*

MICHAEL K. KIRK

*Attesting Officer*   *Acting Commissioner of Patents and Trademarks*